United States Patent [19]

Belke, Jr. et al.

[11] Patent Number: 4,806,704
[45] Date of Patent: Feb. 21, 1989

[54] METAL MATRIX COMPOSITE AND STRUCTURE USING METAL MATRIX COMPOSITES FOR ELECTRONIC APPLICATIONS

[75] Inventors: Robert E. Belke, Jr., Clay; George F. Trojanowski, Baldwinsville; Louis Zakraysek, Cicero, all of N.Y.

[73] Assignee: General Electric Company, Syracuse, N.Y.

[21] Appl. No.: 59,030

[22] Filed: Jun. 8, 1987

[51] Int. Cl.[4] ............................................. H01L 23/06
[52] U.S. Cl. .................................. 174/52.4; 174/68.5; 75/234
[58] Field of Search ..................... 174/52 FP; 357/74; 75/234, 235

[56] References Cited

U.S. PATENT DOCUMENTS 4,105,456 8/1978 Murakami et al. .................. 501/141

FOREIGN PATENT DOCUMENTS 438721 1/1975 U.S.S.R. ................................ 75/234

OTHER PUBLICATIONS

J. H. Fishwick *Application of Lithium in Ceramics* Cahners Pub. Co., Boston, 1974 pp. 23–47.
*Beta-Eucryptite* Technical Data Bulletin 321, Foote Mineral Co., Exton, PA.

*Primary Examiner*—Arthur T. Grimley
*Assistant Examiner*—David A. Tone
*Attorney, Agent, or Firm*—Richard V. Lang; Carl W. Baker; Fred Jacob

[57] ABSTRACT

The invention relates to a metal matrix composite used to support and/or enclose discrete electronic semiconductor devices, monolithic integrated circuits, hybrid circuits, and multi-layer printed wiring boards. The matrices herein disclosed employ aluminum as the matrix with Beta Eucryptite as the additive in a volume percent of up to 60. The preferred range of from 55 to 45 percent by volume of the additive has a coefficient of thermal expansion matching the common semiconductor materials and common ceramics used for electronic enclosures. The composite uses low cost materials, and due to the affinity of the additive to aluminum is easily prepared. The resulting structures have good thermal conductivity and low weight.

9 Claims, 4 Drawing Sheets

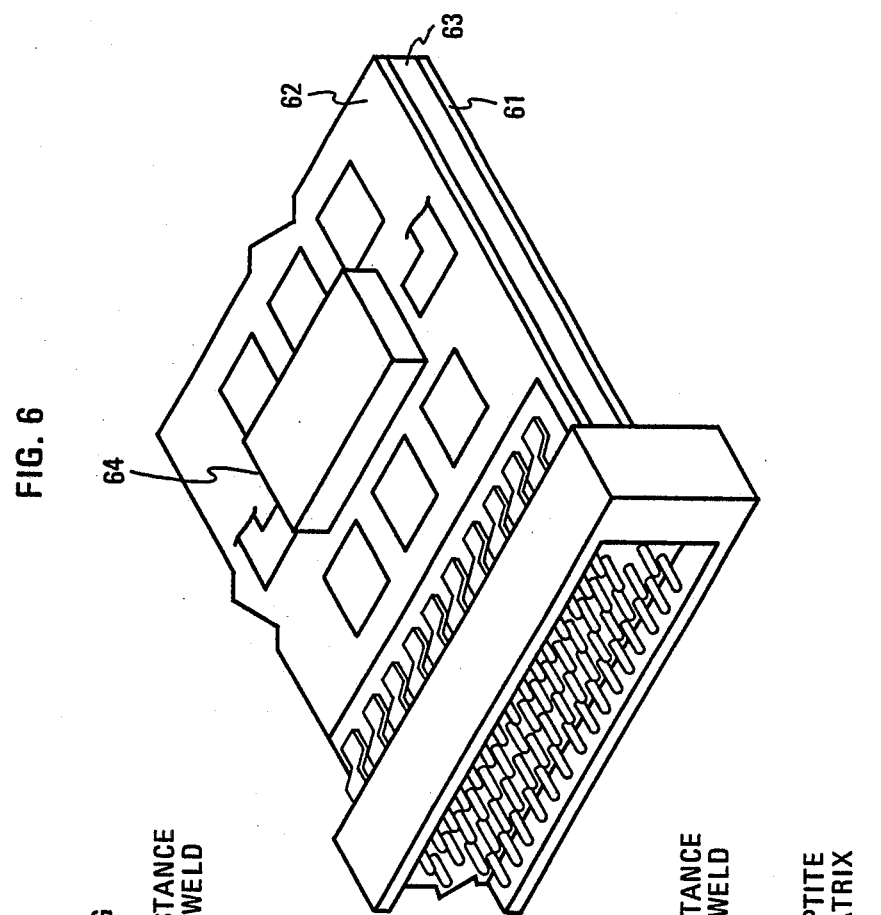
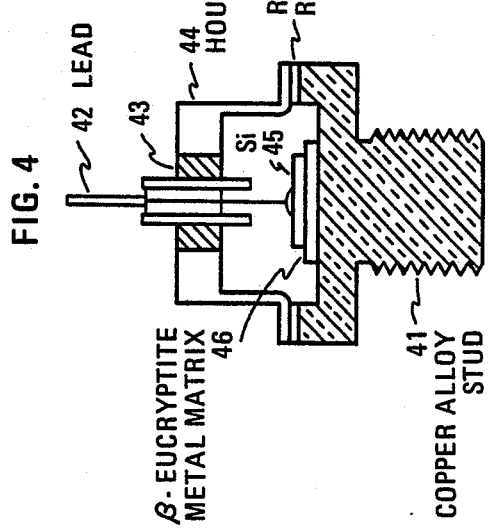
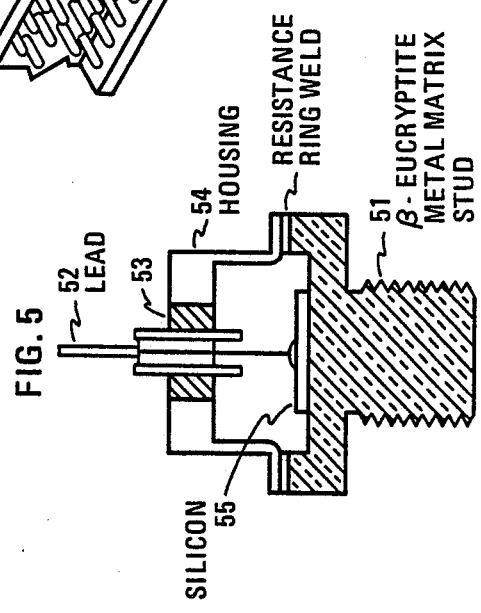

METAL MATRIX COMPOSITE AND STRUCTURE USING METAL MATRIX COMPOSITES FOR ELECTRONIC APPLICATIONS

FIELD OF THE INVENTION

The invention relates to metal matrix composites for structural applications in which a desired coefficient of thermal expansion is required, and more particularly to electronic structures and packaging enclosures tolerant to large ranges of temperature, used to support and/or enclose discrete electronic semiconductor devices, monolithic integrated circuits, hybrid circuits, and multi-layer printed wiring boards.

PRIOR ART

In electronic applications, there is a need for means to enclose electronic circuits in a hermetic environment. The package must ordinarily satisfy several criteria. One is that the package provide an efficient means for heat removal, another is that the package provide supporting surfaces and enclosing structures that can withstand large variations in temperature without damage to the electronics or to the hermetic integrity of the package. A third criteria is that the package be of light weight. One such application is in modules operating at microwave frequencies used in electronically scanned arrays. Such arrays often require a large number (often several thousand) modules. For ease in maintenance, the modules are individually packaged, and interchangeable. Weight reduction becomes significant when the modules are designed for airborne or satellite applications.

A hermetic enclosure is desirable for enhanced reliability of the contained electronics. Such enclosures are called upon to provide the means for supporting and for enclosing the electronics. The electronics usually come in the form of discrete semiconductors, monolithically integrated circuits, and hybrid circuits combining pluralities of individual circuits. Common packaging materials for high temperature hermetic seals include alumina and berylia. Both have coefficients of thermal expansion (CTE) of from 6 to 8 parts per million per degree centigrade. The common semiconductor materials including Silicon, Germanium and Gallium Arsenide have comparable CTE values.

In packaging semiconductor materials, the hermetic package or the semiconductor supporting member must have a CTE that will permit assembly at the temperatures of the glass frits and solders used to effect the bonds without damage, and which will remain operable at temperature ranges from below freezing (e.g. $-50°$ C.) to the upper limits that the electronic parts will tolerate (e.g. $+200°$ C.).

It is known that Beta-Eucryptite, a ceramic material, has a negative CTE and that it may be combined with materials with a positive CTE in selected proportions to produce a composite with a desired CTE. Materials that have been suggested as matrices for such Beta-Eucryptite composites have included epoxies, resins, glasses and other ceramics. The primary emphasis in such applications has been on control of the CTE to effect tolerances to exposure to large ranges of temperature as in ovenware.

Metal matrix composites are known, using a matrix of aluminum and additives of graphite and silicon carbide. The materials have been relatively light in weight and of good thermal conductivity with CTE's in the range of from 9.4 ppm/°C. up to that of aluminum.

SUMMARY OF THE INVENTION

It is an object of the invention to provide a novel metal matrix composite having a low density, high thermal conductivity and a coefficient of thermal expansion matching common semiconductor materials.

It is still another object of the invention to provide a novel metal matrix composite having a low density, high thermal conductivity and a coefficient of thermal expansion matching common materials used in electronic packages.

It is an additional object of the invention to provide a novel support for a semiconductor having a matching CTE, low weight, and good thermal conductivity.

A further object of this invention is to provide a novel enclosure for electronic circuitry combining members of a common packaging ceramic with a novel composite having a matching CTE, low density and high thermal conductivity.

These and other objects of the invention are achieved in a novel metal matrix composite of low density, high thermal conductivity, and a coefficient of thermal expansion in the range of from approximately 4.5 to 23.4 ppm per degree Centigrade. In this composite, the matrix is of aluminum to which Beta-Eucryptite has been added in a range whose upper limit is 60 percent by volume.

In accordance with another facet of the invention, a novel substrate of a material having a CTE of from 4.5 to 8.5 ppm/°C. of aluminum and Beta-Eucryptite composite in a range from 60 to 45 percent by volume is provided to which an electronic semiconductor is bonded. Preferably, the surface of the substrate is clad with a thin aluminum layer to seal the surface. The layer may optionally provide an electrically conductive bond to the electronic semiconductor unanodized or where anodized, an electrically insulative bond to the electronic semiconductor. An excellent match may be provided to the princial materials used for semiconductors including silicon, germanium and gallium arsenide.

In accordance with another aspect of the invention, a novel package for electronic components is provided in which a metal matrix composite base is employed using a matrix of aluminum to which Beta Eucryptite has been added to match the CTE of a lead frame and a ring frame of alumina. The enlosure is completed with a cover of the same metal matrix composite. Both the base and the cover are preferably aluminum clad, with anodizing being performed where an electrically insulating support is desired.

BRIEF DESCRIPTION OF THE DRAWINGS

The inventive and descriptive features of the invention are set forth in the claims of the present application. The invention itself, however, together with further objectives and advantages thereof, may best be understood by reference to the following description and accompanying drawings in which:

FIG. 4 is a cross sectional view of a package for a discrete solid state power dissipating device in which the mechanical support and heat transfer path for the semiconductor body are provided by a novel metal matrix composite;

FIG. 5 is a cross sectional view of a package for a discrete solid state power dissipating device in which the mechanical support, heat transfer path, and electrical connections to one electrode are provided by a novel metal matrix composite, and FIG. 6 is a perspective view of a heat sink utilizing the novel metal matrix composite and an electrical edge connector for a printed circuit board in a typical electronic module.

DESCRIPTION OF THE PREFERRED EMBODIMENTS

Figure 1A:
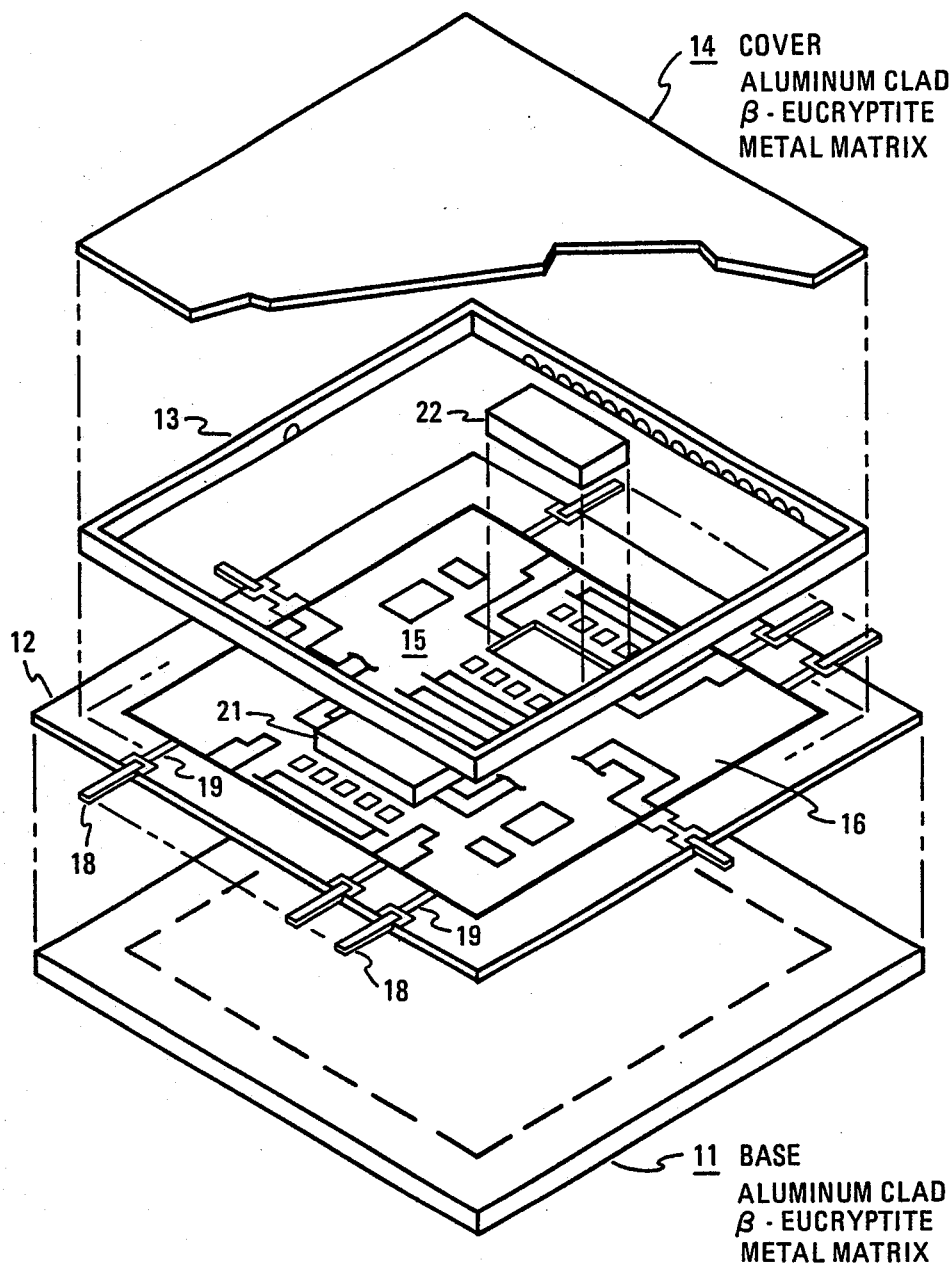
FIG. 1A is an exploded view of a novel lightweight, hermetically sealed, heat transferring electronic package utilizing a novel metal matrix composite for the base and cover, the package being suitable for a hybrid integrated circuit employing a separate ceramic substrate.

Referring now to FIG. 1A, an exploded view of a novel light weight, hermetic package for an electronic circuit is shown. The package consists of a novel metal matrix composite base 11, an alumina lead frame 12, an alumina ring frame 13 and a cover 14 of the same material as the base.

The package is designed to contain a hybrid electronic circuit 15, which is positioned in the plane of the alumina lead frame 12. The circuit 15 includes a substrate 16 of alumina and one monolithically integrated circuit 21 supported upon the substrate in an insulated relation to the base 11 and a second monolithically integrated circuit 22 positioned in a perforation of the substrate and directly bonded to the base. The integrated circuits are interconnected by means of "printed" conductor runs upon the substrate 16. The circuit 15 is bonded via its substrate 16 to the base 11 and electrically connected by "TAB" (tape automatic bonding) to terminals 19 on the lead frame 12. "Flying leads" may also be used for making these connections.

The elements 11-14 are assembled together to form a hermetically sealed enclosure. The base 11 is the major structural element of the package, and provides the means for attaching the constituent elements together to form an integral package as well as the means for attaching the package to a larger electronic assembly.

The base 11 is typically from half an inch to several inches in length and breadth and from 0.025" to 0.25" in thickness. It is of a novel metal matrix composite material containing aluminum and Beta-Eucryptite in proportions suited to matching the coefficient of thermal expansion of the base to other elements of the package. In the embodiment shown in FIGS. 1A and 1B, the selected CTE value should match that of the alumina used for the lead frame 12 and for the ring frame 13.

The aluminum Beta-Eucryptite composite uses low cost materials and is easily fabricated using isostatic hot pressing or sintering. The resulting composite is lightweight, and has good electrical and good thermal conductivity and has a coefficient of thermal expansion (CTE) which is tailorable by adjustment of the percentages of the constituents. In the FIG. 1A, embodiment, the metal matrix composite base 11 provides both an electrical ground connection and a thermal path for heat transfer from the electronic circuit 15 to an external heat sink.

Figure 1B:
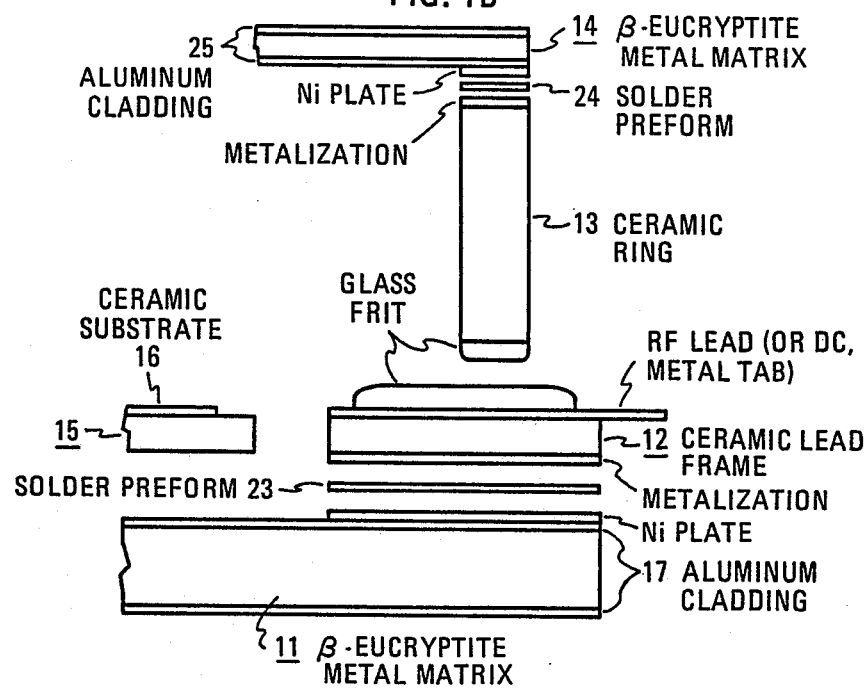
FIG. 1B is an exploded cross sectional view of the wall portion of the FIG. 1A package illustrating the details of the hermetic seal.

The seals of the package of FIG. 1A are shown in FIG. 1B. The base 11 is attached to the lead frame 12, by means of a high temperature solder connection. As illustrated, the upper and under surfaces of the base are processed for further attachment. This is achieved by cladding these surfaces with an aluminum layer 17. At the surface where a solder connection is to be made, the layer 17 is then nickel plated by either an electroless or an electrolytic process and then gold plated. The base 11 is now ready for attachment to the alumina lead frame 12 by means of a high temperature gold-tin solder.

The lead frame 12, the first major package element above the base, supports the external terminal pins 18 by means of which external connections are made to the electronic circuit within the package. Leads 19 connected to the terminal pins and bonded to the lead frame enter the package via the glass seal between the lead frame 12 and the lead ring 13. The inner ends of the leads 19 terminate at the upper edge of the lead frame, where they are bonded to tabs arranged about the perimeter of the substrate 16. The bond of the substrate 16 to the base 11 provides both mechanical support and a path for heat removal.

The alumina lead frame 12 is also prepared for high temperature gold tin solder attachment to the base 11. The alumina is metallized on its undersurface, typically by an electroless nickel plate, to form a solderable surface in assembly. A gold tin solder pre-form 23 is inserted between the nickel plated surfaces on the base 11 and lead frame 12 and heat is used to solder the two together.

The alumina ring frame 13, the second major package element above the base is bonded to the upper surface of the lead frame by a glass seal, through which the leads 19 pass. The upper surface and leads 19 of the lead frame 12 are coated in the region of the seal with a glass frit which is electrically nonconducting. Similarly, the undersurface of the ring frame 13, which is also of alumina, is coated with a glass frit which in assembly fuses into the glass frit on the top surface of the ring frame 12. The use of separate frits is usually preferable. In the assembled configuration, a unitary electrically insulating glass seal is formed between the lead frame and the ring frame, and the leads 19 pass through the seal from inside the package to the terminal pins 18.

The last element of the package is the cover 14 which is bonded to the ring frame 13. The cover is also of the same light weight metal matrix composite employed for the base. The cover is provided with aluminum cladding on the upper and lower surfaces. In the preparation of the seal a nickel plate, suitable for low temperature soldering is applied. Correspondingly, the upper surface of the alumina lead frame 13 is metalized for soldering, typically by an electroless nickel plate. A suitable low temperature solder preform 24 is provided between the two surfaces and they are heated to effect a bond and a hermetic seal which completes the closure of the package.

The enclosure is designed to provide a practical, low cost, lightweight solution to the packaging of electronic circuitry. The enclosure is designed to withstand temperatures in excess of those that the enclosed electronic circuit will survive. In particular, it will readily survive a temperature low of $-125°$ C. and a high approaching the melting temperature of the low temperature solder used in the upper seal. The enclosure is lightweight, and is suitable for airborne or satellite usage, and yet is capable of simple assembly with conventional assembly steps.

The novel metal matrix composite used in the base and cover of the package is a mixture of aluminum and Beta eucryptite proportioned to have a coefficient of thermal expansion substantially equal to that of the alumina used in the lead frame 12 and the ring frame 13. Aluminum has a positive temperature coefficient of 23.4 ppm per degree C., and a commercial form of Beta-Eucrytite has a negative temperature coefficient of $-7$ ppm per degree C. A mixture of about 55 per cent by volume of Beta-Eucryptite in an aluminum matrix (where the aluminum is 45 per cent by volume) provides a coefficient of thermal expansion of approximately $+(6$ to $8)$ ppm per degree C. This approximately matches the thermal coefficient of the metal matrix composite used in the base and cover to the thermal coefficient of the alumina used in the lead frame and ring frame. The package will thereupon withstand the customary ranges in temperature that the contained integrated circuits will withstand without damage to the integrity of the package.

Beta-Eucryptite is a material whose negative coefficient of thermal expansion remains substantially constant over a temperature range of from $0°$ C. to $600°$ C. At the upper end of this range, the value becomes slightly more negative by six-tenths of one percent.

Eucryptite is a lithium alumino silicate material having the formula $Li_2O.Al_2O_3.2SiO_2$. It is one of several lithium materials often occurring together in the natural state. This relationship may be portrayed on a three component phase diagram with $SiO_2$, $Li_2O$ and $Al_2O_3$ at the apices. In this diagram there are four principal materials: Petalite ($Li_2O.Al_2O_3.8SiO_2$), Spodumene ($Li_2O.Al_2O_3.4SiO_2$), Meta-Kaolin ($Al_2O_3.2SiO_2$) and Eucryptite ($Li_2O.Al_2O_3.2SiO_2$). In a more detailed phase diagram, the Eucryptite and Spodumene appear in alpha and beta forms.

Beta-Eucryptite single crystal belong to the higher Quartz space group $P6_222$. The crystal structure closely resembles a "stuffed" derivative of the quartz structure, with half of the $Si^{4+}$ ions replaced by $Al^{3+}$ ions. Lithium ions introduced in the main channels of the structure parallel to the C axis balance the charge. The quartzlike crystal structure also possesses a weak super structure which is affected by the disorder present with increasing temperature. The result of increasing temperature is to increase the LiO distance along the a-axis while there is a decrease along the c-axis—and a net reduction in cell volume. When the cells are randomly oriented in a polycrystalline form at or in a matrix, the Beta-Eucryptite exhibits a bulk negative coefficient of expansion with increasing temperature which is reversible with decreasing temperature.

Beta-Eucryptite is available as a low cost material from several suppliers. The material is normally purchasable in quantity, 30 gallon drums being a conventional package size.

A typical composition, derived from natural sources, includes, in addition to the principal components of $Li_2O(11.27\%)$; $Al_2O_3(36.674\%)$ and $SiO_2(45.22\%)$, traces of $Na_2O$, $K_2O$, $CaO$, $MgO$, and $Fe_2O_3$. The material is available as a powder having 325 mesh particle size, a density of 2.38 gm/cc, and a melting point of $1397°$ C.

Beta-Eucryptite is chemically compatible with the aluminum matrix, appearing to have a natural affinity for aluminum. Pre-treatment of the components to insure adhesion in fabrication of the composite is not required.

As earlier stated, the matrix herein disclosed is aluminum. The aluminum employed includes either "pure" aluminum AA1100, moderately alloyed AA5052, or the heat treatable form AA6061. The starting aluminum is in the powdered form, a mesh of 325 being satisfactory. The aluminum, which has a melting point of $660°$ C. is then mixed with the Beta-Eucryptite and the mixture is sintered in an isostatic press at the sintering temperature. The sintering temperature is normally $50°$ to $100°$ C. below the melting point of the aluminum. The application of heat and pressure is continued for the period required to cause the materials to bond by high temperature diffusion and to approach (e.g. exceed 80%) the theoretical density of the mixture. The period for processing small samples is normally less than half an hour, being shorter as the sintering temperature is elevated toward the melting point.

In these composites, the net thermal coefficient of expansion follows the rule of mixtures in an approximate fashion. The composite thus has a coefficient representing an averaging of the $+23.4$ ppm per degree C. of the aluminum times the partial volume occupied by the aluminum and of the $-7$ ppm per degree C. of the Beta-Eucryptite times the partial volume (e.g. 55%) occupied by the Beta-Eucryptite. The calculated value is about $+7$ ppm per degree C.

As the percentages by volume of the materials are adjusted within the "usable range" (i.e., the range in which a strong sintered composite can be formed), the net coefficient of thermal expansion may be adjusted to a value of specific interest. The aluminum material appears to withstand the internal stresses formed in the composite as the temperature is cycled in part because of its relatively low elastic modulus (i.e. its soft or ductile quality) which is $10 \times 10^6$ psi and in part by its adhesion to the Beta-Eucryptite, of which one component is $Al_2O_3$.

The percentage of Beta-Eucryptite may be increased to an approximately 60% partial volume as a practical upper limit, depending upon the required package strength. At this limit, approximate values of a net CTE of 5 ppm per degree C. may be obtained. At greater percentages, the package of Beta-Eucryptite, becomes more brittle and of less general utility.

The lower limits of admixture of the Beta-Eucryptite with aluminum are of lesser interest in electronic packaging but do provide a composite that is useful in other applications where a higher but tailored CTE is sought. Since aluminum has a larger positive coefficient of thermal expansion than the principal electronic packaging and active semiconductor materials percentages, partial volumes of Beta-Eucryptite in the vicinity of 50% are of greatest interest with these materials. As the percentage of Beta-Eucryptite is reduced below 40%, the CTE of the composite increases continuously to that of pure aluminum, while useful mechanical properties of the sintered composite are maintained. Thus composites using lower percentages of Beta Eurcryptite are suitable for many other applications.

The aluminum Beta-Eucryptite composite may be tailored to provide a workable match of CTE coefficients for alumina (6.7 to 6.0), Beryllia (6.7), Gallium Arsenide (5.8), Germanium (5.8), and Silicon (4.2) which are common packaging and semiconductor materials. The matching of the coefficient need not be exact, and for a small package (e.g. 1"×1") may be inexact by one or two units. As the package size increases or the desired temperature range increases, the mismatch should be smaller.

The package illustrated in FIGS. 1A and 1B is designed to enclose an electronic circuit requiring a hermetic environment over a significant temperature range, to provide a good heat transfer from within the package to the outside, and to be of minimum weight. In the foregoing package, a match of the coefficients of thermal expansion allows the package to withstand temperatures up to the point of destruction of the seals (the melting point of the low temperature solder seal). The heat transfer is approximately that of aluminum metal, and is thus very good. The package uses light weight materials and is thus of light weight. The alumina has a density of 3.9, the aluminum a density of 2.7, and the Beta-Eucryptite a density of 2.4. Thus the package, in its avoidance of kovar, invar, copper, or heavier metallic components is kept light.

Figure 2:
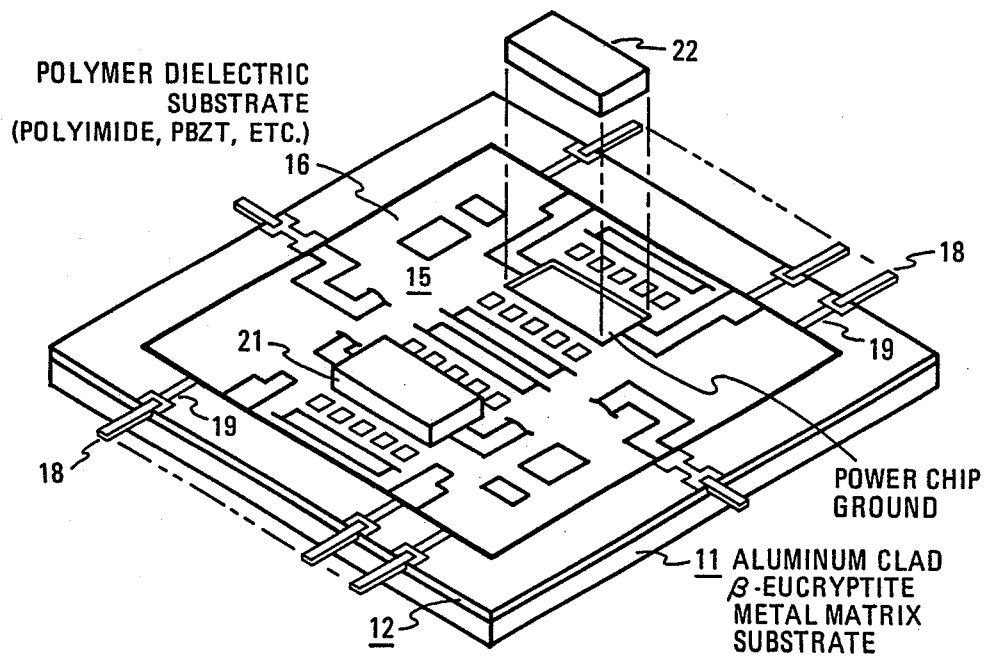
FIG. 2 is an illustration of a portion of an electronic package similar to that illustrated in FIG. 1A shown accomodating a hybrid integrated circuit using a separate polymeric dielectric substrate.

A further application of the invention is illustrated in FIG. 2. These illustrations show the electronic package applied to a hybrid integrated circuit of lower temperature application using a "high temperature polymer" such as a polyimide. The polyimide is capable of withstanding the temperature required to solder components to the substrate and to seal the package by soldering. The formation of the electrical connections between the substrate and the lead frame are otherwise the same as in the FIGS. 1A–1B illustration.

Figure 3A:
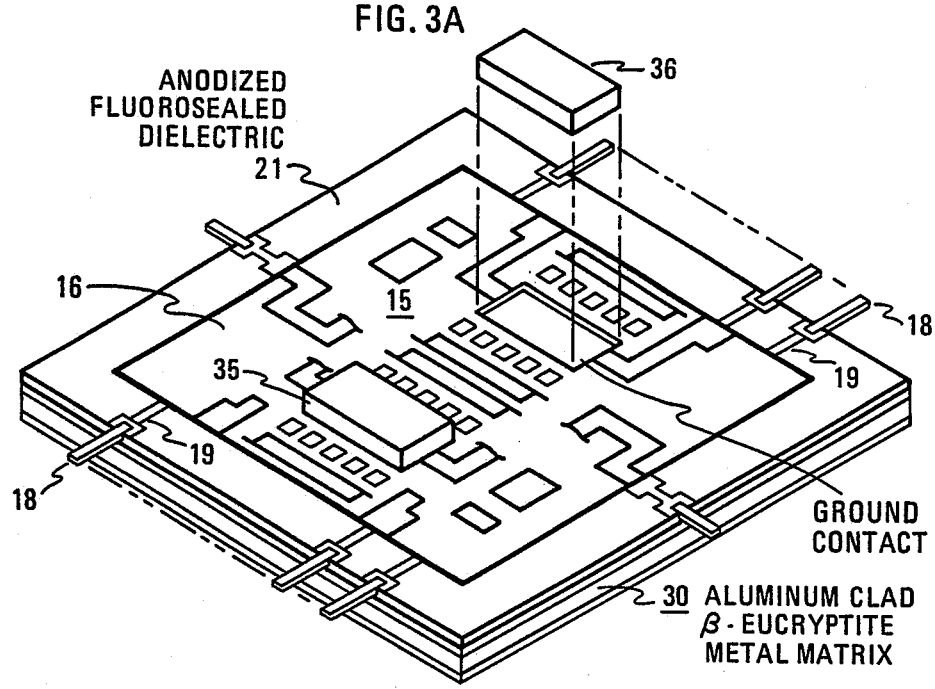
FIG. 3A is an exploded view of a second electronic package for enclosing a heat dissipating electronic circuit in which a novel metal matrix composite provides both the base and lead frame of the package, and integral substrate for mounting monolithically integated circuits.
Figure 3B:
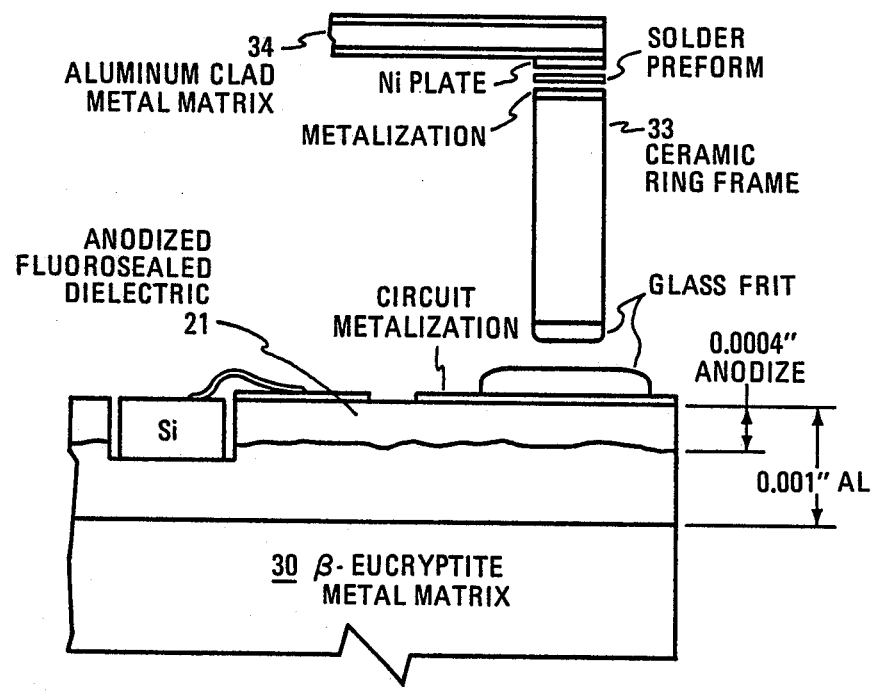
FIG. 3B is an exploded cross sectional view of the wall section of the package corresponding to FIG. 3A, illustrating the details of the hermetic seal from base to cover.

The package of FIG. 2 can be further modified, and the weight reduced, although at the cost of universality, if the base 30 performs the added functions of providing the substrate for the enclosed electronic package and the lead frame, as illustrated in FIGS. 3A and 3B.

As in the prior figures, the metal matrix composite member 30 is clad with a thin aluminum layer, typically a 0.001" foil. The foil is then anodized, as illustrated at 31 (FIG. 3B) to provide an insulating surface upon which to support the leads extending through the package walls. The surface is then fluorosealed to improve the quality of the surface for subsequent processing. The anodized surface within the package provides an insulating supportive surface for an integrated circuit 35. Conductive runs on the hybrid may also be formed upon the anodized surface. Should a grounding connection be desired as under the integrated circuit 36, the anodized surface is either not formed in the first place by masking during the anodization process, or the anodized surface is removed by etching to leave a conductive aluminum layer (representing the remainder of the original foil). A low temperature glass frit is used to seal the base-substrate-lead frame 30 to the alumina ring frame 33. Closure of the package, is completed using an aluminum clad composite cover 34, which is solder sealed to the upper surface of the ring frame 33.

The order of assembly of the package of FIGS. 3A, 3B must take into account the temperature limits of the enclosed circuitry. The conductive runs, and the passive components will normally withstand the temperature required to form the glass frit seal, and thus they may be formed before the ring base 33 is attached to the base 30. However, the active integrated circuits 35 and 36 will not ordinarily withstand the temperature required for the frit seal, and they will be applied afterwards.

In the arrangements so far described the metal matrix composite using aluminum and Beta-Eucryptite may be used as part of a package for an individual integrated circuit or a hybrid integrated circuit. The composite may also be used in packaging a discrete power dissipating device, as for instance a power rectifier.

In the FIG. 4 configuration a conventional silicon power rectifier is shown having a copper studded base 41 for electrical connection to the external power circuit, and for carrying away heat generated in the device. The other connection 42 to the rectifier is taken from the top of the device, which is supported by an insulating ring 43 set in the metal cover 44. The cover 44, through a suitable weld is attached to the studded base 41.

The novel metal matrix composite is used to support the semiconductive member of the power rectifier within the package. The silicon semiconductor wafer 45 is shown supported upon a wafer 46 of the novel metal matrix composite. The composite wafer 46 is aluminum clad to permit a solder attachment to the silicon wafer 45 and to the copper base 41. The wafer composite 46 has a transitional temperature coefficient selected to be between that of copper which has a CTE value of 16.8 and the silicon which has a CTE value of 4.2. A suitable CTE for the composite wafer 46 is near 10.5. The wafer is attached to the copper base at the high temperature required for solder assembly. Thus after assembly, the structure remains at a relatively cooler ambient or operating temperature than when it was formed. This places the copper in tension and the composite wafer 46 and the silicon wafer 45 in compression, which is appropriate for this design.

In the foregoing arrangement, the composite provides a good electrically and thermally conductive path to the studded base 41. In FIG. 5, the metal matrix base 51, preferably aluminum coated, is of a threaded construction arrived at by casting. The silicon wafer 55 is bonded to the base 51 for electrical and thermal connection. In the embodiment, the balance of the housing, including the elements 52, 53 and 54 may be substantially as in the FIG. 4 embodiment.

The steel housing 54, which has a thermal coefficient of 11.5 ppm per degree C., is attached by soldering to the aluminum clad studded base. The thermal coefficient of the composite used in the studded base is preferably selected to reduce stresses to supportable values in both the attached cover 54 and in the attached semiconductor wafer 55. A suitable selection of thermal coefficients is one in which the coefficient of the composite is larger than that of the silicon (4.2), and smaller than that of the steel cover (11.5). Since the attachment occurs at a high temperature, causing compression on the silicon wafer, an intermediate coefficient in the vicinity of 8 ppm per degree C. is appropriate.

In the packaging arrangements so far described, low cost has been intended. The hybrid package, for instance, contemplates planar fabrication of each of the elements of the package by simple molds, without needing further machining to create recesses for the enclosed electronic components. The composite material is very hard, and accordingly, machining while feasible, may be avoided for low cost applications.

The invention may also be employed as a heat sink, and mechanical support for a pair of printed wiring boards as illustrated in FIG. 6. In FIG. 6, a portion of an electronic module is shown comprising a first (61) and a second (62) printing wiring board assembled in a sandwich upon a heat sink and mechanical support 63 of aluminum Beta Eucryptite composite. The assembly is then provided with an electrical edge connector by means of which connections from the pair of printed wiring boards forming an electronic module are supplied to sockets on a mother board. The boards 61 and 62 support a plurality of leadless chip carriers, normally of ceramic.

In the FIG. 6 assembly, the metal matrix composite member 63 provides both a heat sink, and a means to maintain package integrity under temperature cycling. The PWBs 61, 62 are normally tailored to have a CTE approximately equal to those of the chip carriers 64. However, this match may not be very good in practice, and the presence of a strong central number 63 which may be used in a sandwich with two PWBs creates asymetric structure with a lowered CTE, set to insure that the electronic packages 64 are not unduly stressed. Because of its good heat conductivity, the composite member 63 may be used to distribute localized heat over a larger area, or to transfer heat to a heat sink.

The metal matrix material, while shown in generally flat shapes is readily hot pressed into other configurations containing recesses for electronic circuit components.

As earlier noted, the upper practical limit of the volume percent of Beta Eucryptite in the composite is approximately 60%. At this value, using the rule of mixtures a CTE of 4.5 ppm per degree Centigrade is predicted; at 55% a CTE of 6.0 is predicted; and at 50% a CTE of 7.5 ppm per degree Centigrade is predicted. These values are approximate depending on several variables, including trace impurities, and the manner in which the composite is formed. The composite can thus be used to match other materials whose CTEs vary over a range from about 4 CTE (e.g., for silicon which has a CTE of 4.2) to 23.4 CTE corresponding to pure aluminum.

The CTE ranges of interest for supporting semiconductor members is from 4.2 to about 8.5 which includes Silicon at 4.2, Germanium at 5.8, Gallium Arsenide at 5.8; and Sapphire (used to support an active silicon region) 7.7 and 8.3. (A mismatch of 1 or 2 units is acceptable for small members, as noted earlier.) The CTE ranges of interest in high temperature sealed hermetic packages are about 6 to 8, with Beryllia at 6.7, and alumina in a range of from 6 to 6.7 (ppm/°C.). The CTE ranges of interest in lower temperature applications using polymers are usually higher, and approach 12 ppm/°C.

The use of an anodized surface for an aluminum clad composite base, which is subsequently fluorosealed,— provides a very efficient manner of providing an insulating support to an integrated circuit—and an efficient thermal conducting path. The cladding has the advantage of sealing the composite from additional processing steps making it unnecessary for the processing to be compatible with the Beta-Eucryptite. The cladding also adds to the overall mechanical strength of the sandwich.

What is claimed is:

1. A metal matrix composite of low density, high thermal and electrical conductivity, and a coefficient of thermal expansion in the range from approximately 4.5 to 12 parts per million per degree Centigrade, consisting of a matrix of aluminum to which Beta-Eucryptite has been added in a range from 60 to 40 percent by volume.

2. In combination:
   a substrate of a metal matrix composite material of low density, high thermal and electrical conductivity and a coefficient of thermal expansion in the range of from approximately 4.5 to 8.5 parts per million per degree centigrade consisting of a matrix of aluminum to which Beta-Eucryptite has been added in a range from 60 to 45 percent by volume, and
   an electronic semiconductor bonded thereto.

3. The configuration set forth in claim 2 wherein:
   the surface of said substrate is clad with a thin aluminum layer to seal the surface, said layer providing an electrically conductive bond to said electronic semiconductor.

4. The combination as set forth in claim 2, wherein:
   the surface of said substrate is clad with a thin aluminum layer to seal the surface, the layer being anodized, said anodized layer providing an electrically insulating bond to said electronic semiconductor.

5. The combination set forth in claim 2 wherein:
   the percentage of Beta-Eucryptite is from 55 to 45 volume percent, and
   said semiconductor is a member of the class including, silicon, germanium, and gallium arsenide.

6. In a package for electronic components, the combination comprising:
   a metal matrix composite base consisting of a matrix of aluminum to which Beta Eucryptite has been added in a range between 55 and 45 per cent by volume;
   a lead frame of alumina sealed to said base for supporting leads for connection to a contained electronic component.

7. The combination set forth in claim 6 having in addition thereto:
   a ring frame of alumina sealed to said lead frame; and
   a metal matrix composite cover sealed to said ring frame comprising a matrix of aluminum to which Beta Eucryptite has been added in a range between 55 and 45 percent by volume.

8. The combination set forth in claim 7 having in addition thereto:
   an electronic semiconductor bonded to the surface of said base on the package interior, and
   said base is clad with a thin aluminum layer to provide an electrically conductive bond to said electronic semiconductor.

9. The combination set forth in claim 7, having in addition thereto:
   (a) an electronic semiconductor bonded to the surface of said base on the package interior, and
   (b) said base is clad with a thin aluminum layer, the surface being anodized, said anodized layer providing an electrically insulating bond to said electronic semiconductor.

* * * * *